United States Patent [19]

Cambou et al.

[11] Patent Number: 5,449,628
[45] Date of Patent: Sep. 12, 1995

[54] METHOD OF MAKING SEMICONDUCTOR DEVICE HAVING A SHORT GATE LENGTH

[75] Inventors: Bertrand F. Cambou, Mesa; Robert B. Davies, Tempe, both of Ariz.

[73] Assignee: Motorola, Inc., Schaumburg, Ill.

[21] Appl. No.: 179,642

[22] Filed: Jan. 7, 1994

Related U.S. Application Data

[60] Division of Ser. No. 52,856, Apr. 23, 1993, Pat. No. 5,281,839, which is a continuation of Ser. No. 729,662, Jul. 15, 1991, abandoned.

[51] Int. Cl.⁶ .................................. H01L 21/8252
[52] U.S. Cl. ............................ 437/40; 437/44; 437/154; 437/184; 437/912
[58] Field of Search ............... 437/40, 44, 153, 154, 437/176, 184, 912, 958; 148/DIG. 145, DIG. 157

[56] References Cited

U.S. PATENT DOCUMENTS 4,992,387  2/1991  Tamura .............................. 437/40

FOREIGN PATENT DOCUMENTS

0030178   6/1981  European Pat. Off. .
59-225571 12/1984  Japan .
63-87773   4/1988  Japan .
2-205325   8/1990  Japan .

*Primary Examiner*—Chandra Chaudhari
*Attorney, Agent, or Firm*—Miriam Jackson

[57] ABSTRACT

A semiconductor device having a channel region having a first and a second portion. The first and second portions of the channel region are designed so that only a small portion is substantially depleted during operation. Thus, a semiconductor device having a short gate length is fabricated.

17 Claims, 6 Drawing Sheets

METHOD OF MAKING SEMICONDUCTOR DEVICE HAVING A SHORT GATE LENGTH

This is a division of application Ser. No. 08/052,856, now U.S. Pat. No. 5,281,839 filed Apr. 23, 1993 which is a continuation of application Ser. No. 07/729,662, filed Jul. 15, 1991, now abandoned.

BACKGROUND OF THE INVENTION

This invention relates, in general, to semiconductor devices, including, but not limited to, a gallium arsenide device having a short gate length and a method of fabricating it.

An important feature of gallium arsenide devices, such as MESFETs (Metal Semiconductor Field Effect Transistors) or HEMTs (High Electron Mobility Transistors), is its gate length. The length of the gate is directly proportional to the frequency response of these gallium arsenide devices. Devices having a shorter gate length enable higher frequency responses to be achieved. Devices fabricated by standard processing typically have a 20 GHz capability. It would be desirable to fabricate a MESFET having a 100 GHz capability. However, in the past there has been a limit as to how short gate lengths can be fabricated using standard processing techniques, due to the processing constraints of present standard photolithographic means. A way of achieving shorter gate lengths is by using electron beam technology rather than standard photolithographic means. However, electron beam processing is not very manufacturable and is very expensive to use at this time. It would also be desirable to fabricate devices having a short gate length without the use of electron beam technology using a self-aligned gate process. A self-aligned gate process provides for better reproducability and reduces some parasitic capacitances in the device.

SUMMARY OF THE INVENTION

A semiconductor device, comprising a semiconductor material, having a top surface. A first portion of a channel region of a first conductivity type is formed in the semiconductor material extending from the top surface into the semiconductor material. A second portion of the channel region of the first conductivity type is formed in the semiconductor material extending from the top surface into the semiconductor material, wherein the second portion of the channel region is continuous with the first portion of the channel region and extends further into the semiconductor material from the top surface than the first portion of the channel region. A gate layer is disposed on the top surface over a portion of the first and the second portions of the channel region.

DETAILED DESCRIPTION OF THE DRAWINGS

Figure 1:
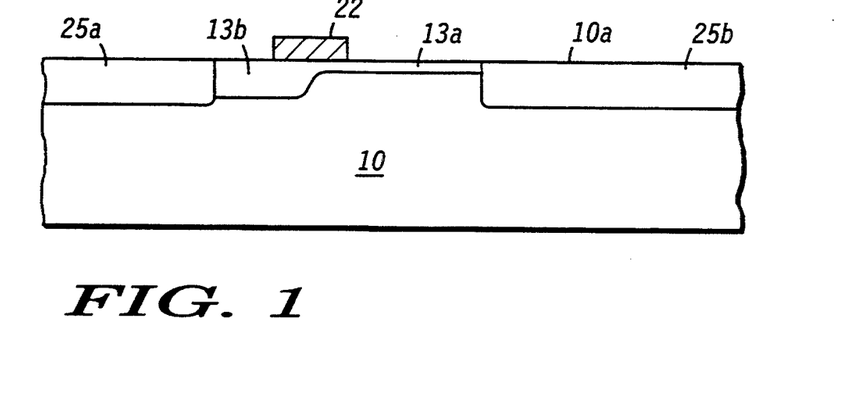
FIG. 1 illustrates an enlarged, cross-sectional view of a first embodiment of the present invention.

FIG. 1 illustrates an enlarged, cross-sectional view of a first embodiment of the present invention in an intermediate stage of fabrication. FIG. 1 illustrates a semiconductor material 10 having a first top surface 10a. In a preferred embodiment, semiconductor material 10 is comprised of a semi-insulating substrate, preferably an undoped gallium arsenide. In semiconductor material 10, a first portion of a channel region 13a is formed extending from first top surface 10a into semiconductor material 10. First portion of channel region 13a is of a first conductivity type. In a preferred embodiment, first portion of channel region 13a is formed to be N-type by ion implantation of suitable dopants, such as silicon. A second portion of channel region 13b is formed extending from first top surface 10a into semiconductor material 10, wherein second portion of channel region 13b is continuous with first portion 13a, but extends further in semiconductor material 10 than does first portion 13a. Second portion of channel region 13b is also of the first conductivity type, and also formed by ion implantation. Second portion of channel region 13b is formed so that it is not substantially depleted during operation of the semiconductor device.

Subsequently, a gate layer 22 is formed on a portion of first top surface 10a extending over a portion of first portion of channel region 13a and a portion of second portion of channel region 13b. Gate layer 22 is comprised of a refractory metal. Because second portion of the channel region 13b is not substantially depleted during operation, the effective gate length can be set by the overlap of gate layer 22 over first portion of the channel region 13a. Source/drain regions 25a and 25b of the first conductivity type are then formed in semiconductor material 10 overlapping portions of first portion of channel region 13a and second portion of channel region 13b. Source/drain regions 25a and 25b are preferably formed by ion implantation of a suitable N+ dopant.

FIG. 1 illustrates the essential parts of a MESFET 10 device. Of course, those skilled in the art will recognize that there are many ways to fabricate the device shown. For example, another way to form the first portion of channel region 13a is by epitaxial layer growth on substrate 10. In addition, the device of FIG. 1 can be formed to be a HEMT device by replacing first portion of channel region 13a by a multilayer channel region including an N+ GaAs layer, an N− GaAs layer, an N− GaAlAs layer, and an undoped GaAs layer. The formation of a HEMT device, not including second portion of the channel region 13b, is well known by those skilled in the art.

Figure 2:
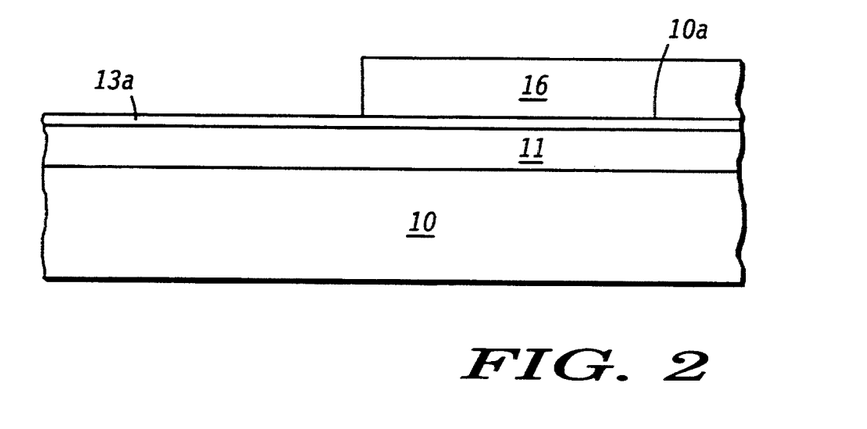
FIG. 2 illustrates an enlarged, cross-sectional view of a second embodiment of the present invention in a beginning stage of fabrication.

FIGS. 2–7 illustrate processing of a second embodiment of a semiconductor MESFET in accordance with the present invention. FIG. 2 illustrates a second embodiment of the present invention in a beginning stage of fabrication. The same numerals used in FIG. 1 will be used to refer to the same or similar regions or layers. First, a doped region 11 is formed by selective ion implantation of suitable dopants of a second conductivity type, P-type in this embodiment, in semiconductor material 10. Then, a first portion of the channel region 13a is formed inside doped region 11 by ion implantation of suitable dopants of the first conductivity type. In a preferred embodiment, silicon is ion implanted at a dose of approximately $1 \times 10^{13}$ atoms/cm$^3$ at an energy of approximately 40 KeV. Other suitable doses and energies may be used. Doped region 11 is used to enhance the characteristics of first portion of the channel region 13a, and is not absolutely necessary to form a working device. Thus, this embodiment, as well as the other embodiments described herein, can be formed with or without doped region 11.

After first portion of the channel region 13a is formed, a dielectric layer 16 is formed over first top surface 10a of semiconductor material 10 and subsequently patterned to be disposed on a portion of first top surface 10a. Dielectric layer 16 is preferably comprised of dielectric layers such as silicon dioxide, silicon nitride, silicon oxynitride, or a combination thereof. In a preferred embodiment, dielectric layer 16 is comprised of silicon nitride. The thickness of dielectric layer 16 is preferably approximately 0.2 to 0.3 microns.

Figure 3:
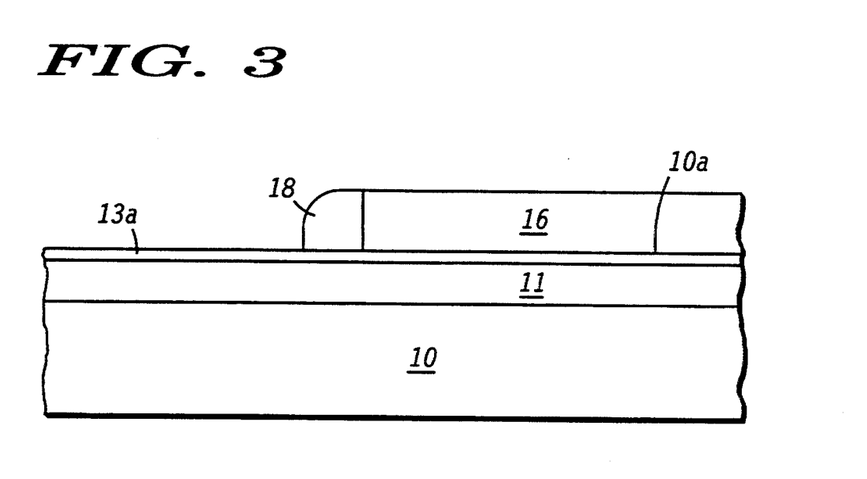
FIG. 3 illustrates an enlarged, cross-sectional view of the second embodiment of the present invention in a further stage of fabrication.

FIG. 3 illustrates the structure of FIG. 2 further along in processing. A conformal layer is formed over first top surface 10a of substrate 10 and over dielectric layer 16 and subsequently etched to form a spacer 18. The formation of spacers by using an anisotropic etch is well known in the art. The conformal layer or spacer 18 may be comprised of a metal layer, a dielectric layer such as silicon dioxide, silicon nitride, silicon oxynitride, or a combination thereof. In a preferred embodiment, the conformal layer or spacer 18 is comprised of a refractory metal.

Figure 4:
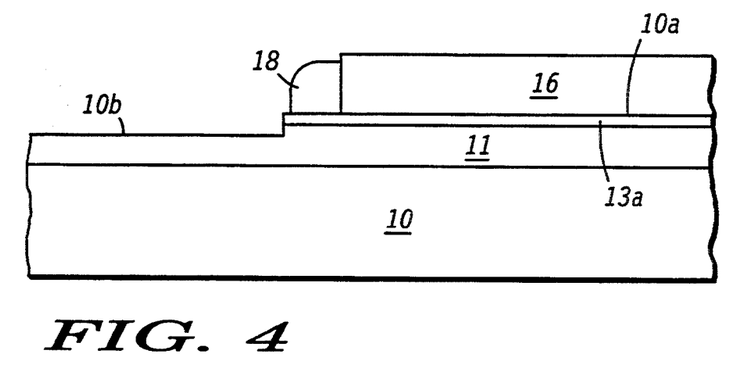
FIG. 4 illustrates an enlarged, cross-sectional view of the second embodiment of the present invention in a further stage of fabrication.

FIG. 4 illustrates the structure of FIG. 3 further along in processing. An etch is performed to remove a portion of doped region 11 and first portion of the channel region 13a in a region adjacent spacer 18 to form a second top surface 10b in semiconductor material 10. Afterwards, the width and the thickness of spacer 18 is reduced by using an isotropic etch. Preferably, approximately 200 Angstroms are removed from spacer 18.

Figure 5:
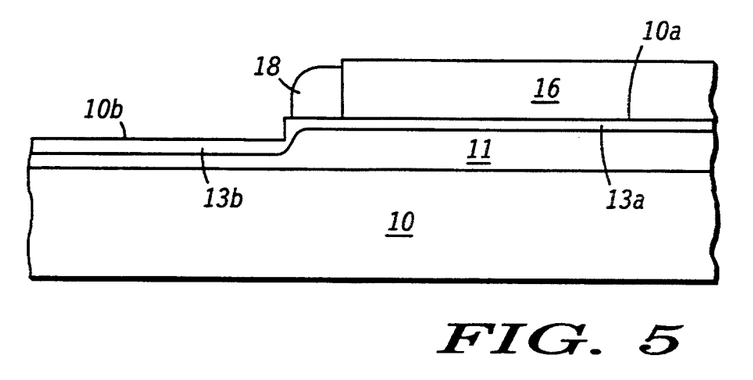
FIG. 5 illustrates an, enlarged, cross-sectional view of the second embodiment of the present invention in a further stage of fabrication.

FIG. 5 illustrates the structure of FIG. 4 further along in processing. Selective ion implantation, similar to the ion implantation used to form first portion of channel region 13a, is performed to form a second portion of the channel region 13b. Spacer 18 and dielectric layer 16 prevent the penetration of dopants thereunder so that second portion of the channel region 13b is formed in semiconductor material 10 extending away from spacer 18. Dielectric layer 16 is spaced a predetermined distance away from second portion of the channel region 13b determined by the width of spacer 18. Suitable dopants of the first conductivity type are used to form region 13b. First and second portions of the channel region 13a and 13b together form a continuous region. The gate length of the MESFET in this embodiment is established by spacer 18, because as explained earlier, second portion of the channel region 13b is fabricated so that it is not substantially depleted during operation. As can also be seen, a method of fabricating a MESFET with a self-aligned gate has been provided.

Figure 6:
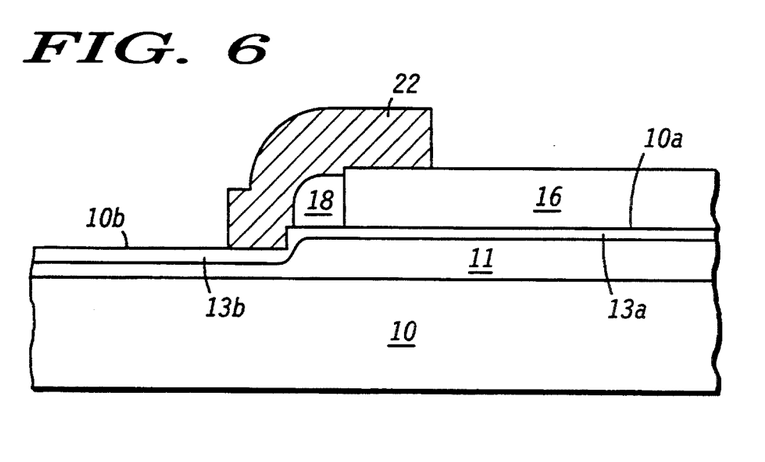
FIG. 6 illustrates an enlarged, cross-sectional view of the second embodiment of the present invention in a further stage of fabrication.

FIG. 6 illustrates a structure as shown in FIG. 5 further along in processing. A layer preferably comprised of a refractory metal is formed on the surface of the structure shown in FIG. 6. The layer is then patterned to form a gate layer 22 which extends over a portion of dielectric layer 16 and over a portion of the second portion of the channel region 13b. If spacer 18 is comprised of a dielectric layer, then it is removed prior to the formation of gate layer 22. However, if spacer 18 is comprised of a refractory metal layer, then it may remain as shown.

Figure 7:
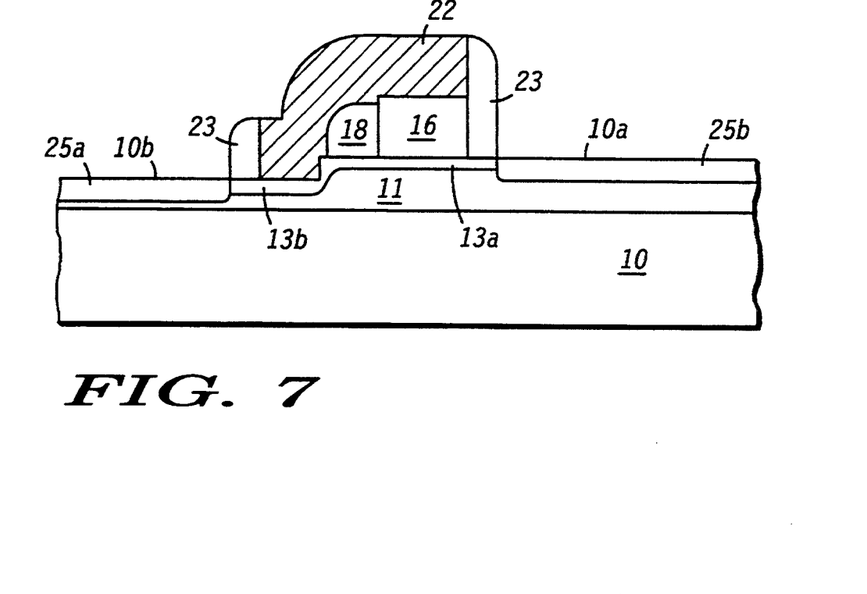
FIG. 7 illustrates an enlarged, cross-sectional view of the second embodiment of the present invention in a further stage of fabrication.

FIG. 7 illustrates a structure as shown in FIG. 6 further along in processing. The portion of dielectric layer 16 where gate layer 22 is not formed thereover is removed using standard etch processes. Subsequently, a conformal layer is formed and etched to form spacers 23 adjacent to gate layer 22 and dielectric layer 16. A source/drain region 25a is then formed in second surface 10b of semiconductor material 10 and a source/drain region 25b is formed in first surface 10a of semiconductor material 10 by ion implantation of suitable dopants of the first conductivity type, in this embodiment, N+ type dopants. Conventional processing is utilized to finish the MESFET, which is not shown here, because it is well known in the art.

Figure 8:
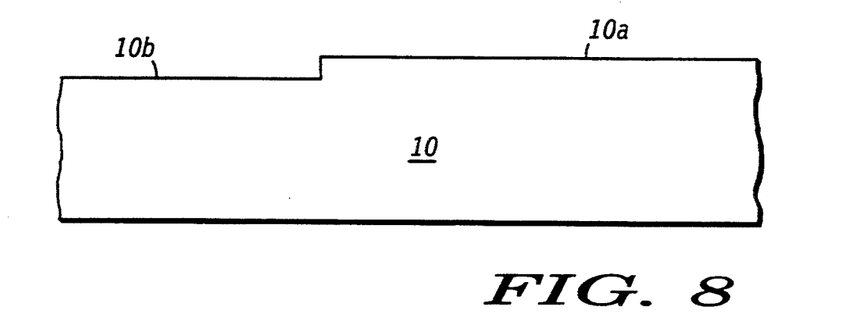
FIG. 8 illustrates an enlarged, cross-sectional view of a third embodiment of the present invention in a beginning stage of fabrication.

FIGS. 8–13 illustrate the processing of a third embodiment of a semiconductor MESFET in accordance with the present invention. The same numerals used in FIGs. 2–7 will be used to refer to the same or similar regions or layers. Where the same or similar regions or layers are formed, the processing thereof is essentially the same as that discussed with reference to FIGS. 2–7, and therefore their formation will not be further elaborated on. FIG. 8 illustrates a third embodiment of the present invention in a beginning stage of fabrication. In this embodiment a portion of semiconductor material 10 is etched first to form a second top surface 10b. This is accomplished by standard processing well known in the art.

Figure 9:
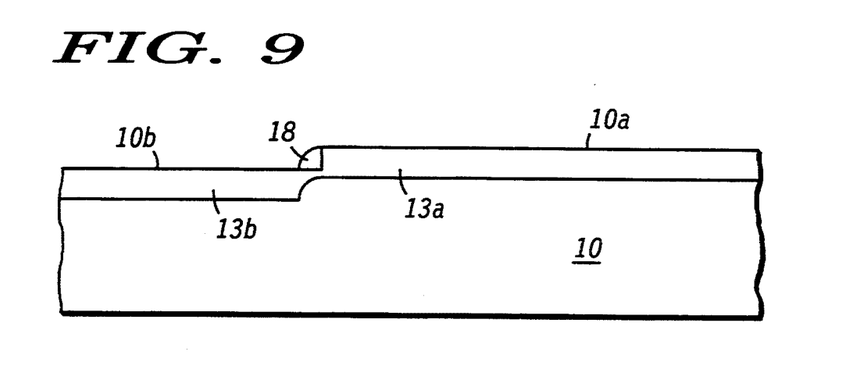
FIG. 9 illustrates an enlarged, cross-sectional view of the third embodiment of the present invention in a further stage of fabrication.

FIG. 9 illustrates the structure of FIG. 8 further along in processing. A spacer 18 is formed on second top surface 10b adjacent to first top surface 10a. Subsequently, a channel region having first and second portions 13a and 13b is formed by ion implantation in semiconductor material 10 extending from first and second top surfaces 10a and 10b, respectively, into semiconductor material 10.

Figure 10:
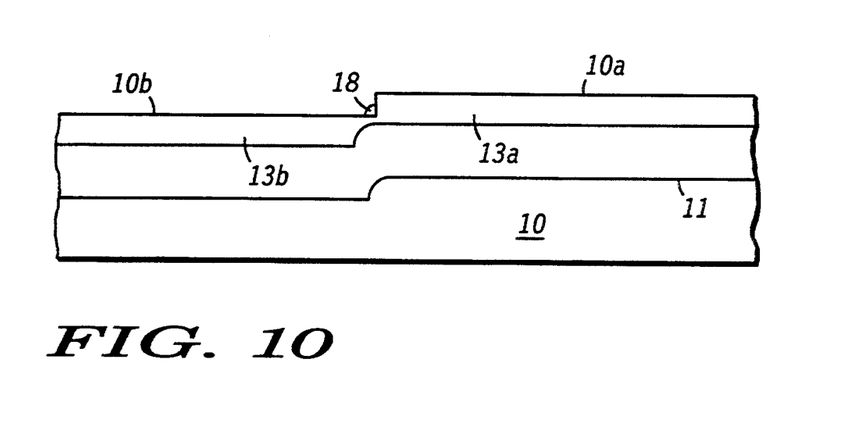
FIG. 10 illustrates an enlarged, cross-sectional view of the third embodiment of the present invention in a further stage of fabrication.

FIG. 10 illustrates the structure of FIG. 9 further along in processing. Spacer 18 is reduced in thickness and width. Doped region 11 is then formed in semiconductor material 10 extending down into semiconductor material 10 further than first and second portions of the channel region 13a and 13b.

Figure 11:
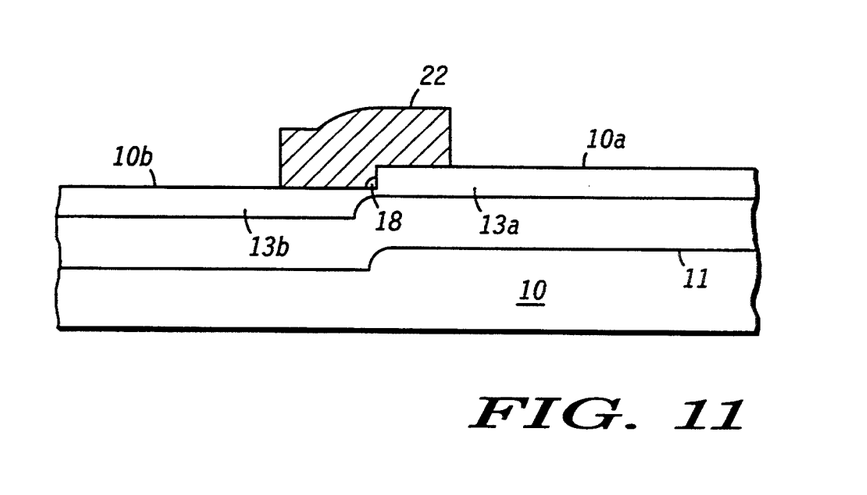
FIG. 11 illustrates an enlarged, cross-sectional view of the third embodiment of the present invention in a further stage of fabrication.

FIG. 11 illustrates the structure of FIG. 10 further along in processing. A gate layer 22 is formed and patterned to extend over a portion of first top surface 10a and over a portion of second top surface 10b.

Figure 12:
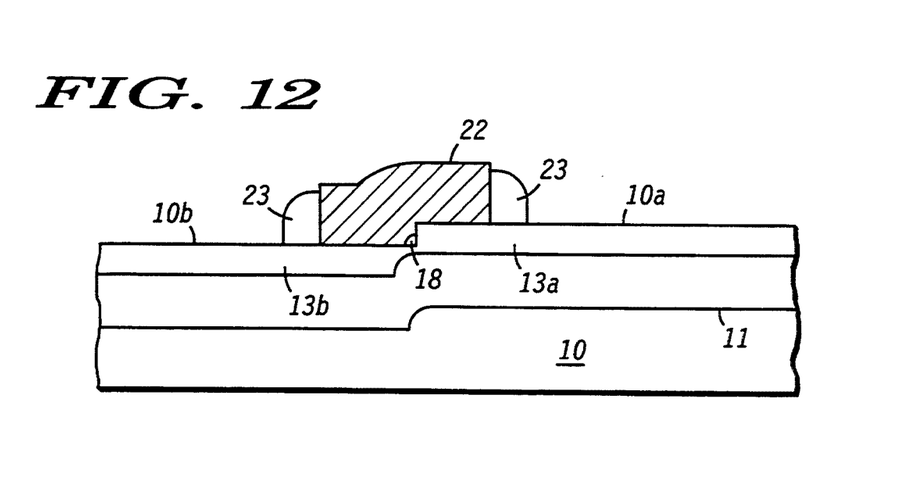
FIG. 12 illustrates an enlarged, cross-sectional view of the third embodiment of the present invention in a further stage of fabrication.

FIG. 12 illustrates the structure of FIG. 11 further along in processing. Spacers 23 are formed adjacent to gate layer 22.

Figure 13:
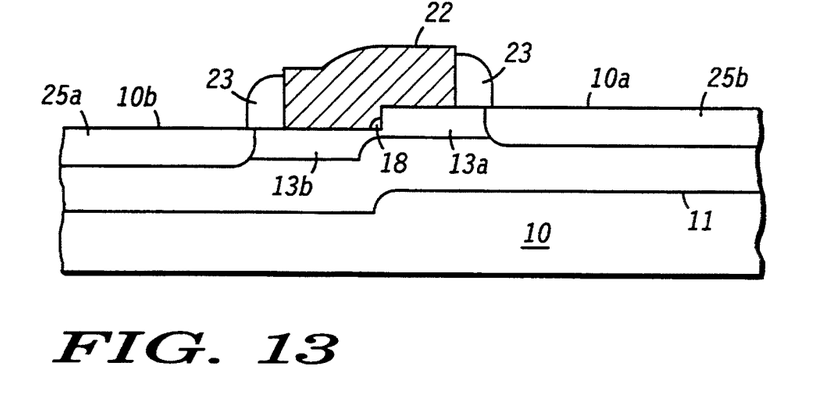
FIG. 13 illustrates an enlarged, cross-sectional view of the third embodiment of the present invention in a further stage of fabrication.

FIG. 13 illustrates the structure of FIG. 12 further along in processing. Source/drain regions 25a and 25b are formed in semiconductor material 10. Conventional processing is used to finish the MESFET.

Figure 14:
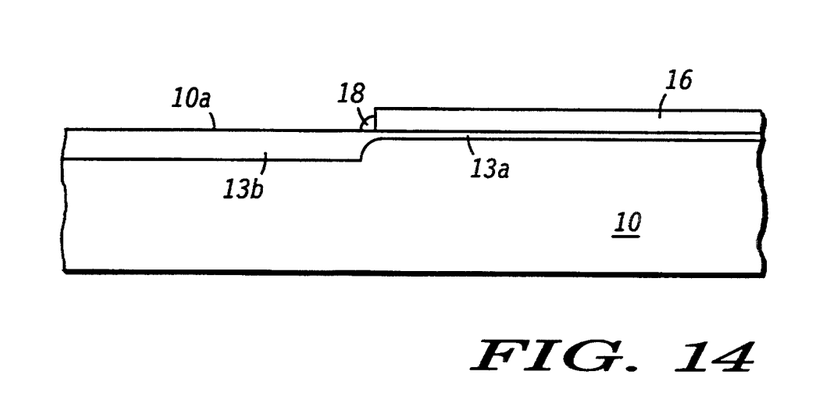
FIG. 14 illustrates an enlarged, cross-sectional view of a fourth embodiment of the present invention in a beginning stage of fabrication.

FIGS. 14–19 illustrate the processing of a fourth embodiment of a semiconductor MESFET in accordance with the present invention. The same numerals will be used to refer to the same or regions or layers as that shown in FIGS. 2–13. FIG. 14 illustrates a fourth embodiment of the present invention in a beginning stage of fabrication. In this embodiment, a dielectric layer 16 is formed on a portion of first top surface 10a as in FIG. 2. Next, a spacer 18 is formed on surface 10a adjacent to dielectric layer 16. Then, a channel region having first and second portions 13a and 13b is formed. Thereafter, doped region 11 is formed. The sequence of forming regions 13a and 13b and 11 may be interchanged.

Figure 15:
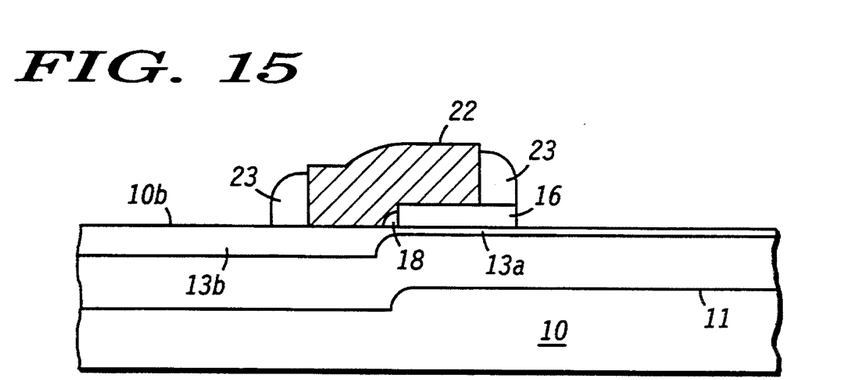
FIG. 15 illustrates an enlarged, cross-sectional view of the fourth embodiment of the present invention in a further stage of fabrication.

FIG. 15 illustrates the structure of FIG. 14 further along in processing. A gate layer 22 is formed, and spacers 23 are then formed adjacent to gate layer 22 as described with reference to the second embodiment. Dielectric layer 16 not protected by gate layer 22 or spacer 23 is then removed.

Figure 16:
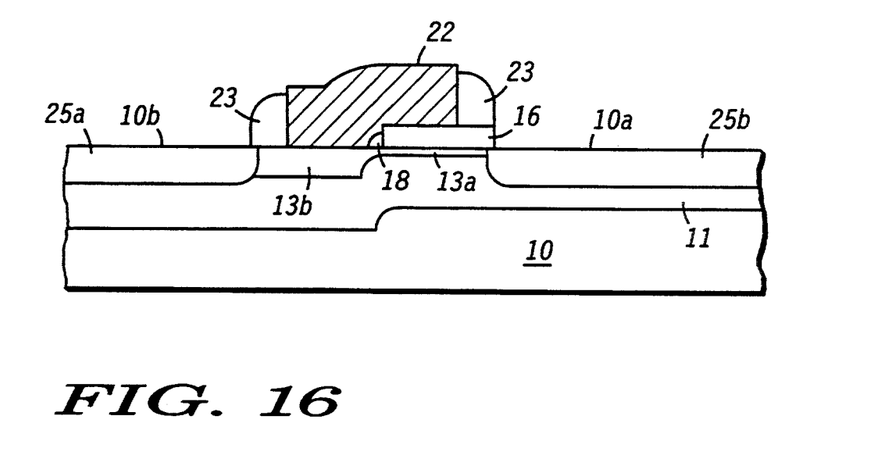
FIG. 16 illustrates an enlarged, cross-sectional view of the fourth embodiment of the present invention in a further stage of fabrication.

FIG. 16 illustrates the structure of FIG. 15 further along in processing. Source/drain regions 25a and 25b are formed in semiconductor material 10. The MESFET is then completed using standard processes well known in the art.

As can be readily seen, there has been provided several methods of fabricating a self-aligned MESFET. The gate length of the MESFET is established by spacer 18 in the second, third, and fourth embodiments. A MESFET having an effective gate length of approximately 0.1 to 0.2 microns can be manufactured by the present invention. This gate length is shorter than that which can be achieved by standard photolithographic means, thus a higher frequency response device is fabricated using the present invention.

We claim:

1. A method of fabricating a semiconductor device, comprising the steps of:
   providing a semiconductor material, having a top surface;
   forming a dielectric layer on a portion of the top surface of the semiconductor material forming a spacer adjacent the dielectric layer:
   forming a first portion of a channel region of a first conductivity type in the semiconductor material extending from the top surface into the semiconductor material;
   forming a second portion of the channel region of the first conductivity type in the semiconductor material extending from the top surface into the semiconductor material, wherein the second portion of the channel region is continuous with the first portion of the channel region and extends further in the semiconductor material from the top surface than the first portion of the channel region; and
   forming a gate layer over a portion of the first portion of the channel region, over a portion of the dielectric layer and over the spacer, such that the gate layer is over a portion of the first and second portions of the channel region.

2. The method of claim 1 further comprising forming a first source/drain region of the first conductivity type in the semiconductor material extending from the top surface into the semiconductor material and overlapping a portion of the first portion of the channel region and forming a second source/drain region in the semiconductor material extending from the top surface into the semiconductor material and overlapping a portion of the second portion of the channel region.

3. The method of claim 1 wherein the step of forming a dielectric layer on a portion of the top surface includes forming the dielectric layer over a portion of the first portion of the channel region at a distance away from the second portion of the channel region.

4. The method of claim 1 further comprising forming a region of a second conductivity type in the semiconductor material extending from the top surface into the semiconductor material further than the second portion of the channel region.

5. The method of claim 1 wherein the step of providing the semiconductor material entails providing the semiconductor material comprised of a semi-insulating gallium arsenide substrate.

6. The method of claim 1 wherein the step of providing the semiconductor material entails providing the semiconductor material with the top surface of the semiconductor material having a first portion and a second portion and wherein the second portion is at a different level than the first portion and further wherein the first portion of the channel region is formed in the semiconductor material in the first portion of the top surface.

7. A method of fabricating a semiconductor device, comprising the steps of:
   providing a semiconductor material, having a first top surface and a second top surface;
   forming a first portion of a channel region of a first conductivity type in the semiconductor material extending from the first top surface into the semiconductor material;
   forming a second portion of the channel region of the first conductivity type in the semiconductor material extending from the second top surface into the semiconductor material and extending from a portion of the first top surface into the semiconductor material, wherein the second portion of the channel region is continuous with the first portion of the channel region;
   forming a spacer on the second top surface adjacent the first top surface on the semiconductor material;
   forming a region of a second conductivity type extending from the first and the second top surface into the semiconductor material further than the second portion of the channel region;

forming a gate layer on a portion of the first top surface and on a portion of the second top surface such that the gate layer is over a portion of the first and second portions of the channel region.

8. The method of claim 7 further comprising forming a first source/drain region of the first conductivity type in the semiconductor material extending from the top surface into the semiconductor material and overlapping a portion of the first portion of the channel region and forming a second source/drain region in the semiconductor material extending from the top surface into the semiconductor material and overlapping a portion of the second portion of the channel region.

9. The method of claim 7 further comprising forming a region of a second conductivity type in the semiconductor material extending from the first and the second top surface into the semiconductor material further than the second portion of the channel region.

10. The method of claim 7 wherein providing the semiconductor material entails providing a semiconductor material comprised of a semi-insulating gallium arsenide substrate.

11. A method of fabricating a semiconductor device comprising the steps of:

providing a semiconductor material, having a first top surface;

forming a first portion of a channel region of a first conductivity type in the first top surface of the semiconductor material;

forming a first dielectric layer on a portion of the first top surface of the semiconductor material;

forming a spacer adjacent the first dielectric layer, wherein the spacer has a thickness and a width;

removing a portion of the first portion of the channel region where the spacer and the first dielectric layer are not disposed, thus forming a second top surface in the semiconductor material;

forming a second portion of the channel region in the second top surface of the semiconductor material and in a portion of the first top surface of the semiconductor material where the spacer is not disposed; and forming a gate layer over a portion of the first dielectric layer, over a portion of the first top surface, and over a portion of the second top surface.

12. The method of claim 11 further comprising forming a source region in the second top surface of the semiconductor material and a drain region in the first top surface of the semiconductor material.

13. The method of claim 11 wherein the spacer is formed by depositing a conformal layer comprised of a silicon nitride layer and a silicon dioxide layer, wherein the silicon nitride layer is disposed on the first top surface of the semiconductor material, and etching the conformal layer to form the spacer.

14. The method of claim 11 wherein forming the first dielectric layer comprises forming a nitride layer.

15. The method of claim 11 further comprising forming a region of a second conductivity type in the semiconductor material extending from the first and the second top surface into the semiconductor material further than the second portion of the channel region.

16. The method of claim 11 further comprising the step of removing a portion of the spacer before the step of forming a second portion of the channel region, the thickness and the width of the spacer being reduced.

17. The method of claim 11 further comprising the step of removing the spacer before the step of forming the gate layer.

* * * * *